INVENTOR.
ROBERT L. JONES
BY Roy M. Pitts
ATTORNEY

INVENTOR.
ROBERT L. JONES
BY
ATTORNEY

INVENTOR.
ROBERT L. JONES
BY [signature]
ATTORNEY

INVENTOR.
ROBERT L. JONES
BY Rolf M. Pitts
ATTORNEY

INVENTOR.
ROBERT L. JONES
BY
ATTORNEY

United States Patent Office
3,434,069
Patented Mar. 18, 1969

3,434,069
DIFFERENTIAL AMPLIFIER HAVING A FEEDBACK PATH INCLUDING A DIFFERENTIAL CURRENT GENERATOR

Robert L. Jones, La Habra, Calif., assignor to North American Rockwell Corporation, a corporation of Delaware Filed Apr. 27, 1967, Ser. No. 634,288
U.S. Cl. 330—30 17 Claims
Int. Cl. H03f 3/68, 1/38

ABSTRACT OF THE DISCLOSURE

A wideband, differential D-C feedback amplifier having common mode rejection, gain stability and D-C stability properties and comprises a direct-coupled differential voltage amplifier stage in cooperation with a pair of differentially-controlled current generators, and a four-terminal high-gain operational amplifier responsively coupled to the output of the differential amplifier. The output of the four-terminal amplifier is feedback-coupled through a differential current converter comprising the pair of differentially controlled current generators. Adjustment of a passive impedance connected across the output of the current generators adjusts the closed loop gain without affecting the closed loop bandwidth.

*Background of the invention*

In the construction of electrical signal amplifiers for use with high quality instrumentation and multiple channel data-recording and telemetry systems, it is frequently necessary to amplify a wide bandwidth (10 kc.) of electrical signals, including D-C signals. Further, the relative amplitudes of such signals to be recorded should be accurately known in order that maximum information may be obtained from subsequent correlation of such signals. Therefore, wide bandwidth, gain stability, and D-C reference level stability are desired. Also, it is frequently necessary to distinguish a relatively small-amplitude, time-varying signal-of-interest from a larger voltage level (either fixed or time-varying) which is common to both input potentials applied to respective terminals of a two-terminal input of the amplifier. Accordingly, it is desired that the amplifier have good common mode rejection properties.

Two general approaches to the design of common mode rejection amplifiers, utilized mutually-exclusively in the prior art, rely on the use of a four-terminal D-C coupled amplifier stage, as distinguished from a conventional three-terminal amplifier having a first input terminal, first output terminal and a common input-output (grounded) terminal. One (open-loop) approach employs a differential-voltage signalling stage having two input amplifier stages connected mutually in parallel and commonly in series with a single-ended current generator, the control input of each amplifier stage being connected to a respective one of the terminals of a two-terminal signal-source. The floating output of the differential voltage signalling stage is connected to the input of the four-terminal amplifier. Such arrangement, while providing good common mode rejection is subject to D-C null drift and gain variations in the output of the four-terminal amplifier; and requires frequent gain calibration and D-C null adjustment.

A second (closed-loop) design approach employs a high-gain four-terminal amplifier having a first output terminal in phase inversion cooperation with a feedback impedance, to provide negative feedback for gain stability, and further having a second output terminal grounded to a reference potential, relative to which common mode rejection is sought. The two input terminals are coupled to the two sources of input potential (relative to ground or the reference potential), the difference therebetween corresponding to the input signal of interest. Although gain stability is achieved by such feedback arrangement, system performance and common mode rejection capability is degraded by unbalance between the source impedance associated with such sources of potential. Such unbalance may be continuously varying due to continuous excitation of the bridge impedance or pick-off network impedance of a continuously-excited transducer or the like and hence is not subject to calibration.

A survey of prior common-mode rejection amplifier techniques is represented by the following U.S. patents: 2,852,625, A. Nuut; 2,896,031, F. M. Young; 3,046,487, W. T. Matzen et al.; 3,130,373, N. B. Braymer; 3,189,840, N. B. Braymer et al.; 3,210,672, J. R. Cox et al.; 3,262,066, T. R. Trilling; 3,275,944, T. J. Lavin; and 3,775,945, N. C. Walker et al.

U.S. Patent 3,189,840 to Braymer, noted-above, includes a valuable discourse on prior art attempts to achieve a structure having a single-ended output and combining the performance features of direct coupling, common mode rejection, and wide bandwidth, including stable D-C response. The concept of Braymer seeks to accomplish these features by a multiple feedback arrangement in which the output of a signal information detector or comparator (in response to an applied input) is employed by both a four port signal information amplifier and a separate, biased common mode detector (or interference signal variation detector) in parallel with the information amplifier. The outputs of the two amplifiers are combined in a feedback network which differentially applies the information signal amplifier output to the comparator, while commonly applying the biased common mode detector output to the comparator. In this way, the feedback network provides negative feedback for both signal information gain stability and common mode rejection.

Several disadvantages inhere in the above described device of Braymer. First, the reliance on two parallel forward loop signalling paths or amplifiers, one for information signal detection and the other for common mode detection, employs and requires a number of adjustable parameters which must be calibrated in order to obtain the desired quality of performance. Also, the reliance on several forward loop amplifiers for performing different functions reduces the system reliability. In other words, the failure of either one of the amplifiers prevents the system from performing properly, although such failure may not be manifest due to continued operation of the other amplifier.

*Summary of the invention*

By means of the concept of the subject invention, the above noted disadvantages and limitations of the prior art are avoided, and only a sigle four-port amplifier is employed in an improved closed loop arrangement.

In a preferred embodiment of the invention, there is provided a direct-coupled differential signalling device of the type including a four-port signal translator having a first and a grounded second output terminal and further having two input terminals coupled to differential voltage signalling means which is excited by a current generator and adapted to be responsive to the difference between two applied input potentials relative to a ground potential. There is also provided feedback means comprising a single-ended voltage-to-differential current feedback stage interposed between the current generator and the differential voltage signalling means and having a voltage input responsive to the output potential of the four-port translator, relative to a reference ground potential, for providing differentially controlled excitation of the differential voltage signalling means. Gain control is provided by means of a two-terminal feedback impedance connected across a first and second output of the voltage-to-differential current feedback stage.

In normal operation of the above-described arrangement, the sense of cooperation of the feedback stage and four-port signal translator is selected to provide negative feedback control of a direct-current operating point and common mode response, while adjustment of the feedback impedance adjusts the gain of the differential voltage signalling response. Because the differential current generator feedback arrangement cooperates with the differential voltage forward loop amplifier to amplify that differential signal input representing information, while suppressing a signal mode or component common to the two inputs of the forward loop amplifier, only a single signalling forward loop is required. Also, because direct coupling is employed, wide bandwidth response (including D-C response) is retained and the direct-coupled common-mode rejection feedback loop also serves to provide stable D-C response. Accordingly, it is an object of the subject invention to provide improved differential signalling means.

It is another object of the invention to provide closed-loop differential signalling means having a differential current generator in the feedback path.

It is still another object to provide closed-loop common-mode rejection means having an adjustable signal gain while maintaining substantially fixed bandwidth performance in both information signal translation and common-mode rejection responses.

A further object of the invention is to provide differential signalling means employing a minimum number of signalling channels and requiring a minimum number of calibration adjustments.

These and other objects of the invention will become apparent from the following description, taken together with the accompanying drawings, in which:

*Brief description of the drawings*

In the figures, like reference characters refer to like parts.

*Description of the preferred embodiments*

Figure 1:
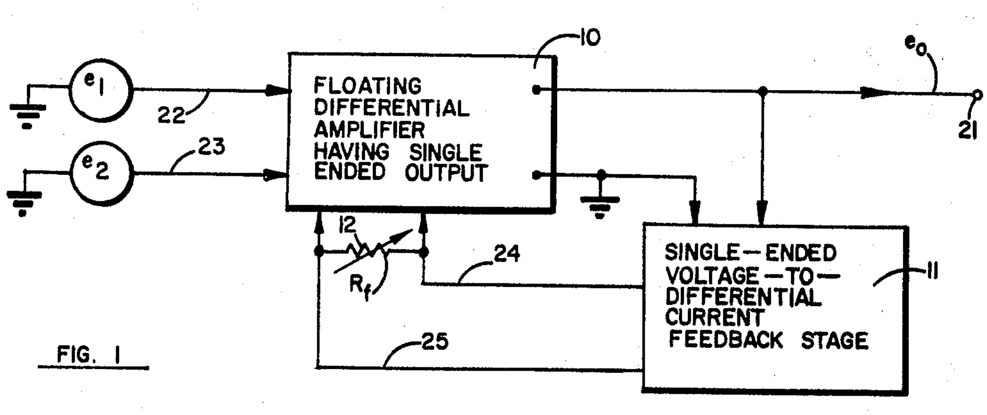
FIG. 1 is a block diagram of a system embodying the inventive concept.

Referring now to FIG. 1, there is illustrated a differential amplifier 10 having a single-ended output response (on terminal 21) which is feedback coupled to amplifier 10 by a single-ended voltage-to-differential current feedback stage having a differential gain control feedback impedance 12 coupled across the feedback output 24 and 25 thereof. Amplifier 10 is preferably a high-gain element, providing a forward loop gain as high as 1000:1.

In normal operation, feedback stage 11 responds to an output potential on terminal 21 to differentially control the excitation of the input stages of differential amplifier 10. In the absence of an input potential difference applied across the inputs of amplifier 10 (e.g., the two inputs 22 and 23 are both connected to ground), any output potential on terminal 21 (relative to ground) will be due to either the presence of a common mode present at the two inputs of amplifier 10 or to a D-C drift within amplifier 10. Feedback stage 11 functions to differentially control the excitation of the input stages of amplifier 10 in such sense as to oppose such output, and thus effects both D-C stabilization and common-mode rejection. Because of the near-symmetry, or almost common response, of feedback lines 24 and 25 in compensatorily biasing the system for either D-C offset or a time-varying common mode component, very little differential current flows through feedback resistor 12. In other words, normal resistor values, not shorting the output of feedback stage 11, have no substantial effect upon D-C stabilization and common-mode rejection.

Where a potential difference ($|e_1-e_2|\neq 0$) exists between two respective ones of inputs 22 and 23, then feedback stage 11 tends to differentially excite the two differential voltage amplifying stages of amplifier 10 as to oppose such differential voltage input. The effect of feedback resistor 12 is to produce a voltage drop which opposes such differential excitation by shunting the differential excitation circuit thereby differentially biasing the emitters of transistors 28 and 29. In other words, the overall, or the closed loop, differential gain, output volts (on terminal 21) per differential volt (across lines 22 and 23) is increased as the floating feedback IR drop across resistor 12 is reduced by reducing the resistance $R_f$ of feedback resistor 12. (In the limit, of course, a zero resistance or short circuit ($R_f=0$) prevents effective excitation of amplifier 10.)

Figure 2:
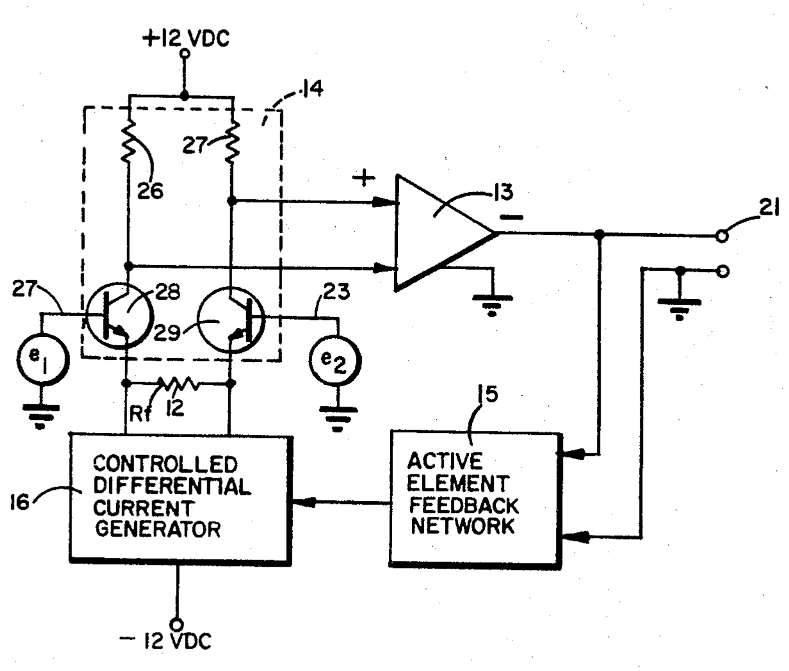
FIG. 2 is a schematic diagram, partly in block form, of the system of FIG. 1 and illustrating the cooperation of the differential voltage signalling stages of a differential amplifier with a controlled differential current generator, differentially controlled by the output of the differential amplifier.

The differentially controlled excitation of amplifier 11 is shown more particularly in FIG. 2 by a four-terminal amplifier 13 having a first and second input terminal connected to the respective load impedance of two voltage-amplifier valve circuits, the emitters of valves 28 and 29 being connected to a differentially controlled excitation source or current generator 16. Differential control of generator 16 is accomplished by coupling a control input of generator 16 to the output of amplifier 13 by feedback network 15, elements 15 and 16 of FIG. 2 corresponding to element 11 of FIG. 1. The arrangement of feedback network 15 and current generator 16 is shown in further detail in FIG. 3. In such arrangement, the differential current feedback stage comprises a single-ended voltage to differential current generator 18 in cooperation with a current generator 19 for providing a differentially controlled double-ended current output to a double-ended current generator 20, in response to a single-ended output potential on terminal 21. Current generator 20 comprises a pair of current control valves 30 and 31 each coupled for connecting a mutually exclusive one of signalling halves of a differential amplifier (comprising the emitter-collector circuits of transistors 28 and 29) to a source of constant electrical excitation, the base-emitter circuits of valves 30 and 31 being commonly biased by a common bias current control source 32. Current generator 20 further comprises a first and second summing impedance 33 and 34, each connected in circuit with the emitter-collector circuit of a respective one of current control valves 30 and 31. The two differentially-controlled outputs of converter 18 are each applied to a respective one of summing impedances 33 and 34 so as to provide a negative feedback in response to an output potential on output terminal 21. Generator 18 is comprised of two valves 35 and 36 having emitter-collector circuits, each coupling a respective one of summing resistors 33 and 34 to current generator 19 and having a base, or control electrode, coupled to a respective one of the output terminals of amplifier 13.

In the absence of an output potential at terminal 21, the separate current flow through lines 37 and 38 will tend to be as similar as the matching of parallel components (35 and 36, 39 and 40) will permit. Thus, no differential current flow through transistors 28 and 29 occurs due to the feedback arrangement. However, where a D-C offset occurs at terminal 21 in the absence of a differential input (e.g., $|e_1-e_2|=0$), then a current differential is produced between the currents in lines 37 and 38 which results in a change in the current flows through resistors 33 and 34 which are sensed as changes in the IR drops thereacross. Each of current control valves 30 and 31 cooperate with fixed bias 32 to regulate the current through an associated one of the base-emitter circuit resistors 33 and 34, thereby differentially controlling the collector-emitter currents through transistors 28 and 29 in a sense to reduce the D-C output offset.

Where the output may, either in addition or alternatively, demonstrate a time-varying component due to a common mode included in source $e_1$ and $e_2$, then the differential control provided by elements 18 and 20 will include a similarly varying compensatory component. Normally, amplifier 13 will ideally respond to the differential output across resistors 26 and 27 to provide a single-ended output on terminal 21. In the absence of a potential difference between sources $e_1$ and $e_2$, a finite output on terminal 21 in response to a common mode may be due to assymmetries in the circuit parameters, which will be compensated for by the above-described cooperation of elements 18 and 20. Such compensation does not employ the source impedances of sources $e_1$ and $e_2$ and, therefore, a lack of symmetry between them does not affect common mode rejection.

Figure 3:
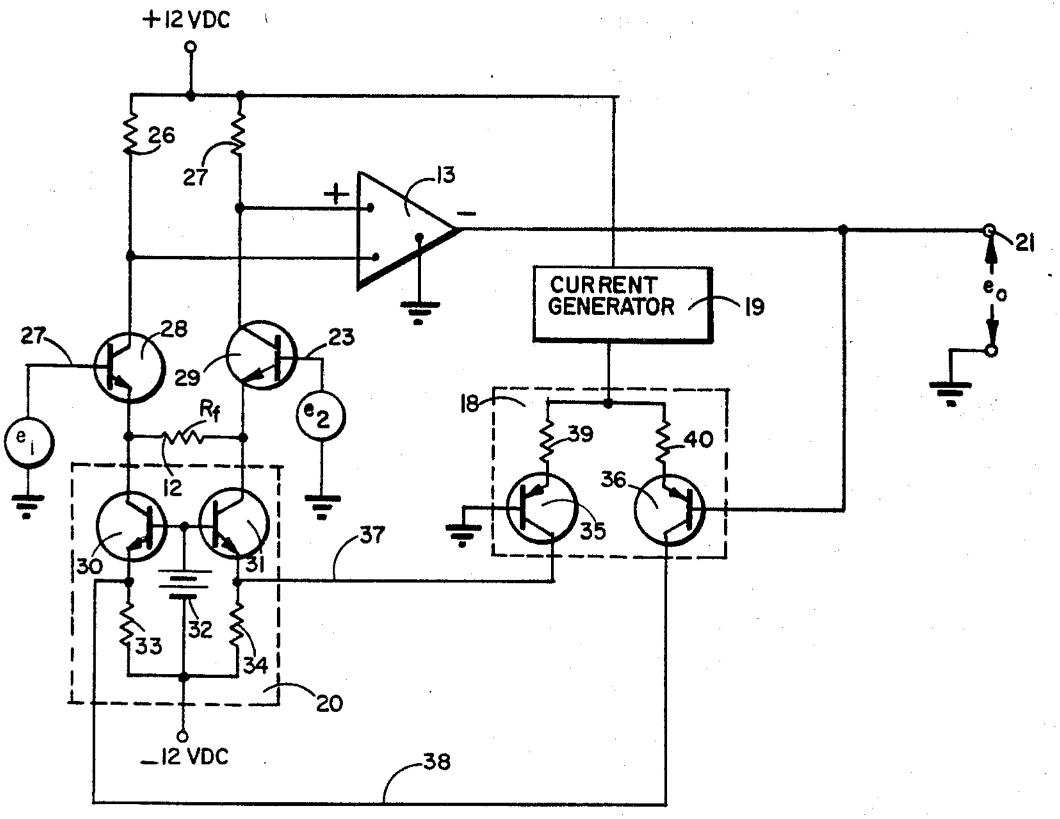
FIG. 3 is a schematic arrangement, illustrating the device of FIG. 2 in further detail.

With the operating points of the several amplifier stages of FIG. 3 feedback-compensated to provide a null output in the absence of a differential input potential, the application of differential input to the bases or control electrodes of transistors 28 and 29 results in amplification and translation of such applied input to output terminal 21, the overall gain of the translated signal being adjusted by adjustment of the impedance $R_f$ of feedback impedance 12. Although the closed loop gain is controlled or increased, relative to the open-loop gain of amplifier 13, by adjusting or reducing resistor 12, the maximum closed-loop gain and useful closed loop bandwidth are limited by closed loop stability considerations and allowable signal level limitations, which may be compensated for in a specific design, as shown in detail in FIGS. 4 and 5.

Figure 4:
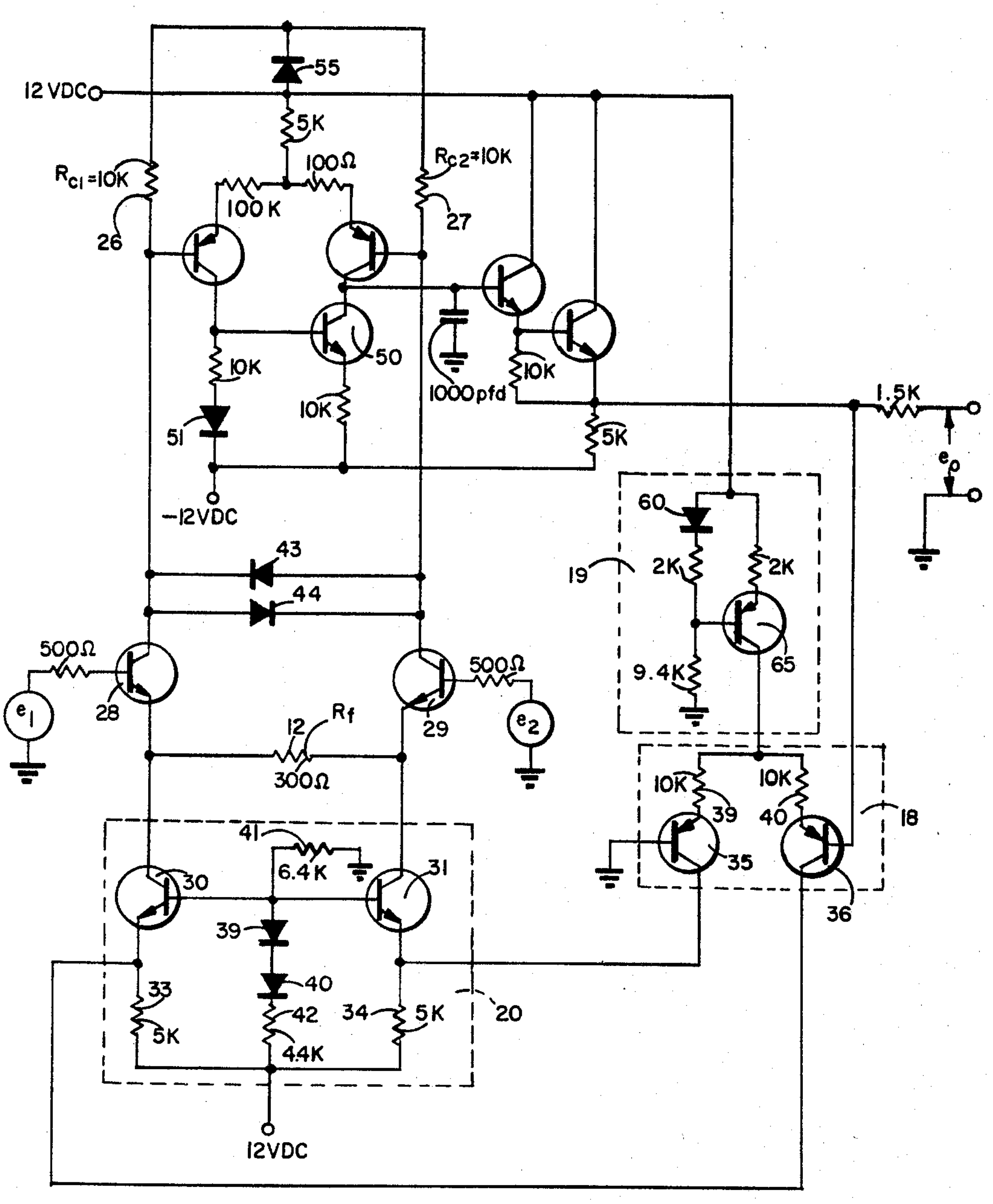
FIG. 4 is a detail circuit diagram of one embodiment of the device of FIG. 3.

Referring now to FIG. 4, there is illustrated a detail schematic diagram of a circuit embodying the inventive concept of FIG. 3. In such arrangement, the function of biasing means 32 of FIG. 3 is provided by the illustrated cooperation of diodes 39 and 40 and resistors 41 and 42. In addition, a bipolar signal-limiting feature is incorporated by means of oppositely-poled diodes 43 and 44 connected across resistors 26 and 27 for maintaining proper bias levels under saturated amplifier conditions. Also, a diode 51 is included in amplifier 13 for temperature compensation of transistor 50; another diode 60 included in current generator 19 for temperature compensation of transistor 65.

The arrangement of FIG. 4 has been observed to operate successfully for differential signal levels as high as ±6 volts, and having a bandwidth of 0–10 kc., with closed loop gains from unity (1) to 100:1.

Wider bandwidths may be accommodated by the incorporation of frequency-sensitive impedance means, as shown more particularly in the preferred arrangement, the function of bias means 32 of FIG. 3 is provided by bias resistor 46 and diode 45. High-frequency phase-lag compensation is provided for differential input signals by means of an R-C series network of elements 47 and 48 connected across resistors 26 and 27. By means of this arrangement a bandpass as high as 0–10 mc. may be accommodated at closed loop gains as high a 25:1 with a four-terminal amplifier 13 having an open-loop gain of at least 1000:1.

In such arrangement, a diode 52 is included to reduce the base-emitter voltage discontinuity of amplifier 13.

Also, transistors 53 and 54 are included as emitter follower stages to provide a respective source of low input base current to each of transistors 28 and 29, and are arranged with the collectors connected to the +12 v. D-C but to reduce the input shunt capacity, to avoid compromising the high frequency response. The adjustable R-C networks provided by elements 56, 57, 58 and 59 are to compensate for the cut-off frequencies or upper bandpass limits of the transistors of amplifier 13.

Figure 5:
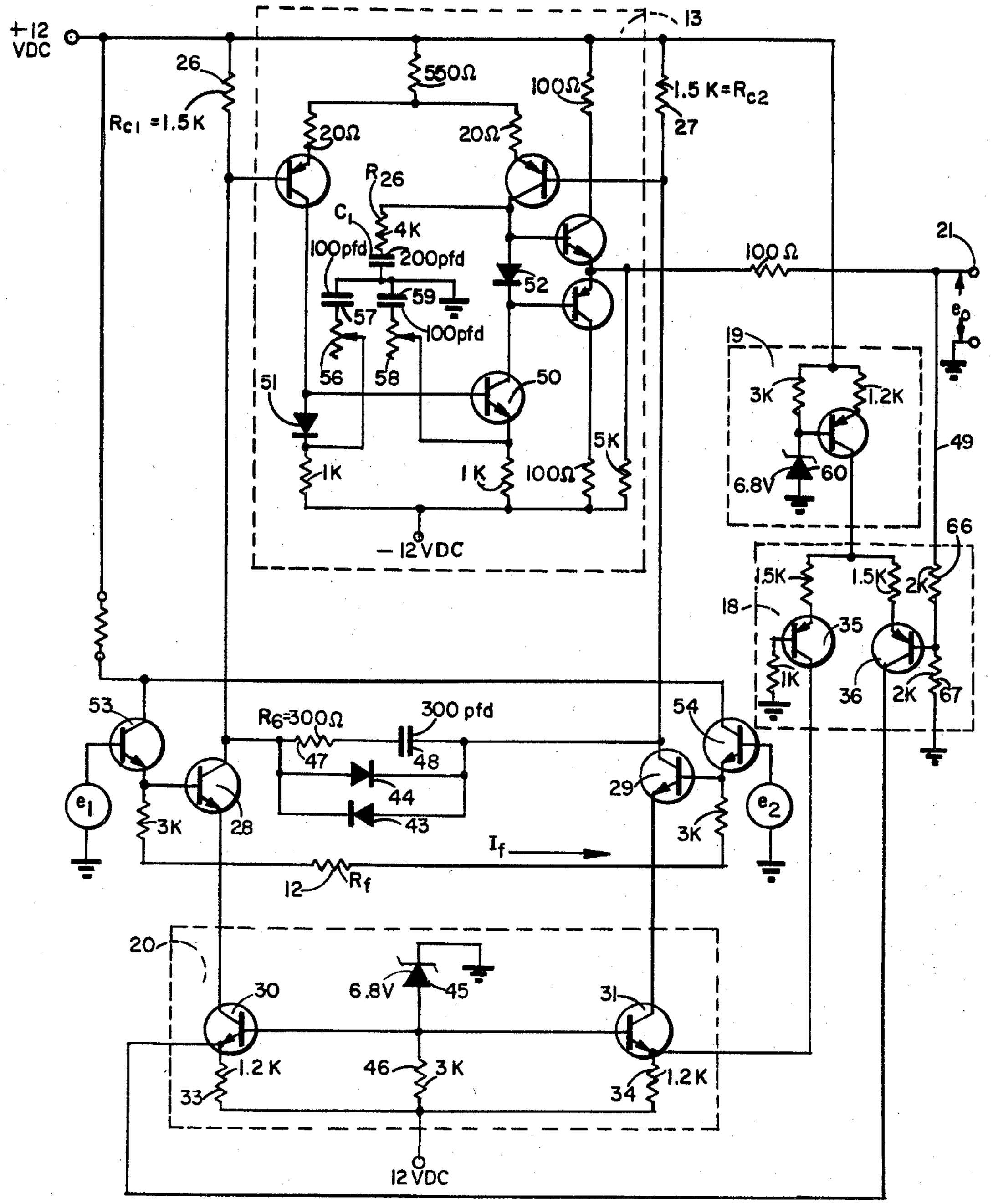
FIG. 5 is a circuit diagram of a preferred embodiment adapted for exceptionally wideband response.
Figure 6:
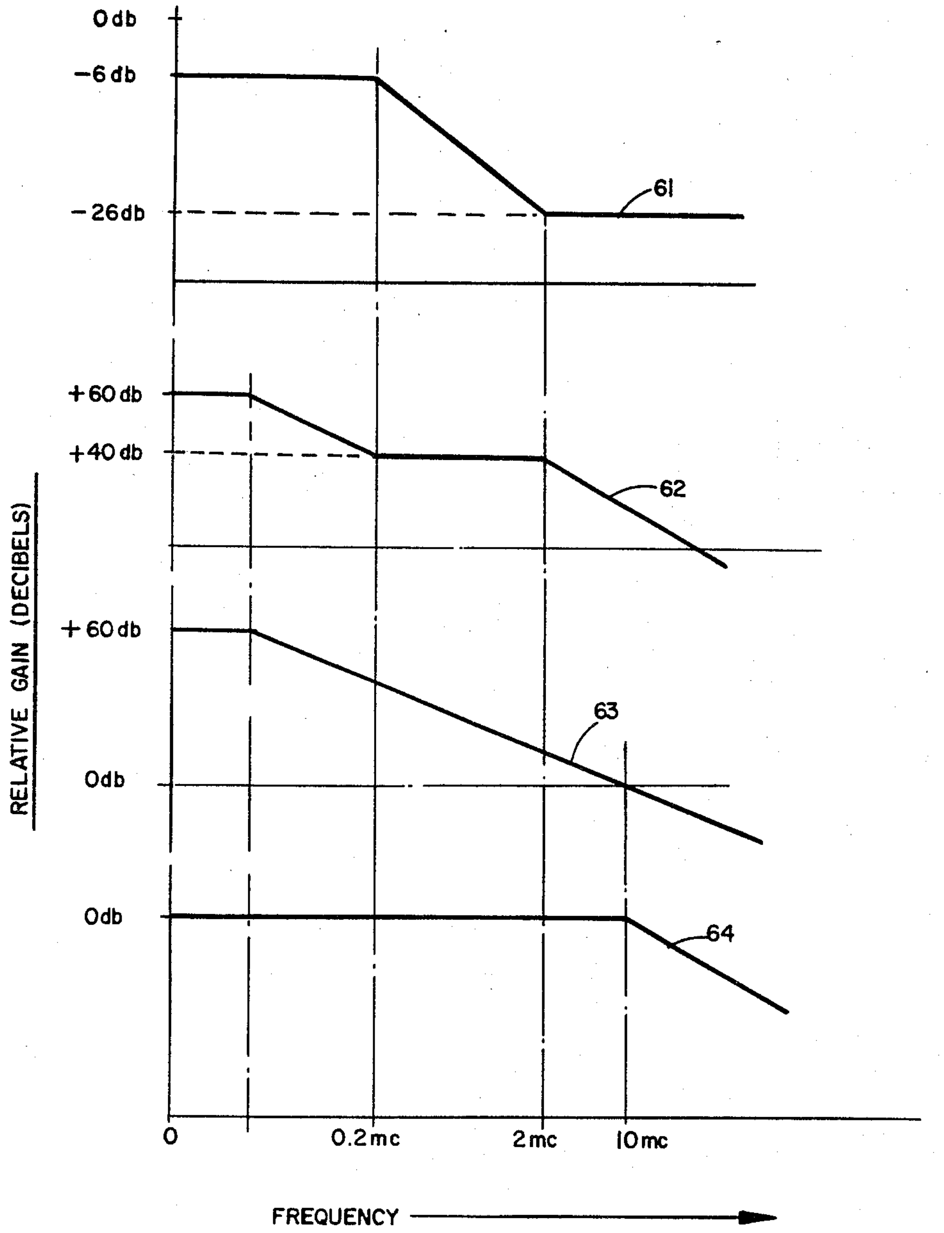
FIG. 6 is a family of frequency response diagrams for the arrangement of FIG. 5.

In order to obtain a preferred wideband performance of the closed-loop arrangement of FIG. 5, certain gain and time constant relationships should preferably be established between certain stages of the open loop mechanization, as shown more particularly in FIG. 6.

Referring to FIG. 6, there is illustrated a family of frequency response curves of the relative amplitude response of portions of the arrangement of FIG. 5, plotted as functions of the frequency of an applied input. Curve 61 represents the response of a first stage through transistors 28 and 29 of FIG. 5, (measured across resistors 26 and 27) with feedback line 49 disconnected from output terminal 21 and connected to a source of excitation; and with the control electrodes of transistors 53 and 54 shorted to ground. Curve 62 represents the response of second stage corresponding to amplifier 13; curve 63 represents the combined open-loop response of both stages (or the logarithmic sum of curves 61 and 62), and curve 64 represents the closed loop response associated with the open loop characteristic of curve 63 (as is well understood in the art of feedback systems design).

The first break frequency for curve 61 (shown at 0.2 kc.) is determined by the time constant formed by resistors 26 and 27 and capacitor 48. The second break frequency of curve 62 (shown as preferably corresponding to the first break frequency of curve 61) is determined by resistor $R_{26}$ and capacitor $C_1$ of amplifier 13. The third break frequency of curve 62 (shown as occurring at 2 kc.) is due to stray capacitance effects in cooperation with resistor $R_{26}$.

The second break frequency of curve 61 (shown as preferably corresponding to the third break frequency of curve 62) is determined by resistor 47 and capacitor 48.

By matching the break frequencies of curves 61 and 62 by adjustment of the indicated parameters affecting the break frequencies, the high-gain 6 db/octave slope of curve 63 is obtained, as the open-loop loop response. Hence, the closed-loop response obtained (by reconnecting line 46 to terminal 21) will be a flat response, out to where open-loop curve 63 crosses the 0 db line. The actual D-C gain in closed-loop operation, corresponding to the exemplary 0 db gain shown for curve 64, may be adjusted without affecting the response bandwidth by merely adjusting the value $R_f$ of resistor 12. Such gain term for the arrangement of FIG. 4 may be developed analytically in terms of the differential current $I_f$ through feedback resistance $R_f$, and the gain $K_1$ of amplifier 13, as follows:

$$e_0=[(e_1-e_2)-I_f R_f]\left[\frac{R_{c_1}+R_{c_2}}{R_f}\right]K_1 \qquad (1)$$

where:

$$I_f=K_f e_0$$

and $$K_f=\frac{1}{R_{21}+R_{22}}$$

Equation 1 may be rearranged to read:

$$\frac{e_0}{e_1 e_2}=\frac{\left[\frac{R_{c_1}+R_{c_2}}{K_f}\right]K_1}{1+\frac{K_1(R_{c_1}+R_{c_2})}{(R_{21}+R_{22})}}\rightarrow\left[\frac{R_{21}+R_{22}}{R_f}\right] \qquad (2)$$

where $K_1 \gg 1.0$

The resultant gain expression of Equation 2 is also applicable to the arrangement of FIG. 5, but for the application of a scaling factor $\beta$, corresponding to the attenuation of the feedback signal $e_0$ by voltage-dividing resistors 66 and 67:

$$K' = \frac{R_{c_1} + R_{c_2}}{\beta R_f} \qquad (3)$$

Accordingly, there has been described signal translating means employing a novel feedback arrangement for achieving common-mode rejection, wide band response, gain stabilization, D-C stabilization, and means for adjusting the differential gain response independently of the bandwidth response.

Although the invention has been illustrated and described in detail, it is to be clearly understood that the same is by way of illustration and example only and is not to be taken by way of limitation, the spirit and scope of the invention being limited only by the terms of the appended claims.

I claim:

1. In a direct-coupled differential signalling device of the type including a four-port signal translator having a first output terminal and a sceond grounded output terminal and further having two input terminals coupled to differential voltage signalling means which is excited by a current generator and adapted to be responsive to the difference between two applied input potentials relative to a ground reference potential, the improvement of feedback means comprising:

a single ended voltage-to-differential current feedback stage interposed between said current generator and said differential voltage signalling means and having a voltage input responsive to the output potential of said four-port translator relative to said reference ground potential for providing differentially controlled excitation of said differential voltage signalling means; and two-terminal feedback impedance means connected across a first and second output of said voltage-to-differential current feedback stage.

2. The device of claim 1 in which the sense of cooperation of said feedback stage and said four-port signal translator provides negative feedback control.

3. The device of claim 1 in which said two-terminal feedback means comprises a passive impedance element.

4. The device of claim 3 in which said four-port translator cooperates with said feedback stage and said passive impedance element as a high-gain phase-inverting four-port translator.

5. The device of claim 1 in which said single-ended voltage-to-differential current feedback stage comprises:

a pair of electrical current control valves, each coupled for connecting a mutually exclusive one of signalling halves of said differential voltage signalling means to a source of constant electrical excitation, said valves each having a control terminal commonly connected to a bias current control source;

a first and second current summing impedance in circuit with a respective one of the control terminals of said current control valves; and a single-ended voltage-to-differential current converter, for providing a first and second current output, differentially controlled in response to an input voltage applied by the output of said signal translator, said first and second current outputs coupled to a respective one of said current-summing impedances for differential control of said electrical current control valves.

6. The device of claim 1 in which said single-ended voltage-to-differential current feedback stage comprises:

a single-ended constant current source having an output, and a first and second current control valve mutually coupled in parallel and commonly coupled in series with the output of said single-ended constant current source, each said control valve having a control terminal connected to a respective one of said output terminals of said four-port translator for differential control of the currents through said two control valves as a single ended voltage-to-differential current converter.

7. The device of claim 1 in which said single-ended voltage to differential current feedback stage comprises:

a single-ended constant current source having an output;

a first and second current control valve mutually coupled in parallel and commonly coupled in series with the output of said single-ended constant current source, each said control valve having a control terminal connected to a respective one of said output terminals of said four-port translator for differential control of the currents through said two control valves as a single-ended voltage-to-differential current converter;

a third and fourth electrical current control valve, each coupled for connecting a mutually exclusive one of signalling halves of said differential voltage signalling means to a source of constant electrical excitation, said third and fourth valves each having a control terminal commonly connected to bias current control source;

a first and second current summing impedance in circuit with a respective one of the control terminals of said current control valves; and a single-ended voltage to differential current converter, for providing a first and second current output, a respective one of said current-summing impedances coupled to an output of a respective one of said first and second valves for differential control of said third and fourth electrical current control valves.

8. In a differential signalling device of the type having a high-gain four-port amplifier with one output port connected to a source of a reference ground potential and with two floating input terminals adapted to be coupled to a respective one of two input potentials relative to said reference potential, the combination comprising:

a differential current generator having two generator halves, an input of said generator connected across the two output terminals of said amplifier, an output of each of said halves of said generator being drivingly coupled to a mutually exclusive one of the inputs of said amplifier; and a feedback impedance connected across said outputs of said generator.

9. In a differential signalling device of the type having a high-gain four-port amplifier with one output port connected to a source of a reference ground potential, the combination comprising:

a differential voltage amplifier having two amplifier halves, an input of each of said halves adapted to be coupled to a respective one of two input potentials relative to said reference potential, and each of said halves having an output terminal coupled to a mutually exclusive one of two input terminals of said four-port amplifier;

a differential current generator having two generator halves, an input of said generator responsive to an output potential across said four-port amplifier, an output of each of said halves of said generator being drivingly coupled to excite a mutually exclusive one of the halves of said differential amplifier; and a feedback impedance connected across said outputs of said generator.

10. The device of claim 9 in which the sense of the cooperation of said differential amplifier and said differential current generator provides a negative feedback to said four-port amplifier.

11. The device of claim 9 in which the interconnections of said four-port amplifier, voltage amplifier and current generator are direct-current couplings.

12. The device of claim 9 in which the interconnections of said four-port amplifier, voltage amplifier and current generator direct-current couplings providing negative feedback control.

13. The device of claim 9 in which the sense of cooperation of said differential current amplifier with said four-port amplifier tends to suppress a common-mode potential occurring in both applied inputs of said differential signalling device and appearing at the output of said four-port amplifier relative to a ground reference potential.

14. In a differential signalling device of the type having a high-gain four-port amplifier with one output port connected to a source of a reference ground potential, the combination comprising:

a first differential voltage amplifier having two amplifier halves, an input of each of said halves adapted to be coupled to a respective one of two input potentials relative to said reference potential, and each said half having an output terminal coupled to a mutually exclusive one of two input terminals of said four-port amplifier; and feedback impedance means including a differential current generator having two generator halves, an input of said generator connected across said output terminals of said four-port amplifier, an output of each of said halves of said generator being drivingly coupled to a mutually exclusive one of the amplifier halves of said differential voltage amplifier, and a feedback impedance connected across said output of said generator.

15. Differential signal amplifying means, comprising:

a four-port high gain signal translator having two input terminals and a first and grounded second output terminal;

a first differential voltage amplifier having two amplifier halves, an input of each of said halves adapted to be coupled to a respective one of two input potentials relative to a reference ground potential, and each said half having an output terminal coupled to a mutually exclusive one of said input terminals of said signal translator; and feedback impedance means including a differential current generator having two generator halves, an input of each of said halves of said generator connected to a mutually exclusive one of said output terminals of said signal translator, an output of each of said halves of said generator being drivingly connected to a mutually exclusive one of the amplifier halves of said amplifier, and a feedback impedance connected across said outputs of said generator.

16. A differential signalling device, comprising in combination:

a four-port high-gain signal translator having an output terminal connected to a source of a reference ground potential;

a differential amplifier stage having first and second voltage amplifier stages, each stage having an output direct coupled to a mutually exclusive one of two input terminals of said four-port signal translator and further having an input terminal adapted to be responsive to a mutually exclusive one of two input potentials relative to said reference potential;

a first constant current generator;

a single-ended voltage-to-differential current converter responsively coupled to said first current generator for providing a double ended D–C control output and having a voltage control input coupled to the output of said four-port signal translator for differential control of said double-ended control output;

a second constant current generator having two differential current generator stages, each generator stage coupled to excite a mutually exclusive one of said voltage amplifier stages and being responsive to a mutually exclusive output of said double-ended D–C control output; and a two-terminal feedback impedance connected across the output coupling of said differential current generator stages of said second current generator.

17. The device of claim 16 in which the sense of the cooperation of said single-ended converter and said second generator corresponds to a negative feedback to said four-port translator.

References Cited

UNITED STATES PATENTS

| | | | |
|---|---|---|---|
| 3,280,347 | 10/1966 | Blokker et al. ------ | 330—30 X |
| 3,346,817 | 10/1967 | Walker et al. ------ | 330—30 X |

ROY LAKE, *Primary Examiner.*

LAWRENCE J. DAHL, *Assistant Examiner.*

U.S. Cl. X.R.

330—26